United States Patent
Chobanyan et al.

(10) Patent No.: US 10,356,964 B2
(45) Date of Patent: Jul. 16, 2019

(54) WAVEGUIDE STRUCTURES

(71) Applicant: Hewlett Packard Enterprise Development LP, Houston, TX (US)

(72) Inventors: Elene Chobanyan, Fort Collins, CO (US); Karl J. Bois, Fort Collins, CO (US); Dave Mayer, Fort Collins, CO (US); Arlen L. Roesner, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 61 days.

(21) Appl. No.: 15/215,982

(22) Filed: Jul. 21, 2016

(65) Prior Publication Data
US 2018/0026325 A1    Jan. 25, 2018

(51) Int. Cl.
*H05K 9/00* (2006.01)
*H01P 1/30* (2006.01)
*H01P 5/02* (2006.01)

(52) U.S. Cl.
CPC ............ *H05K 9/0007* (2013.01); *H01P 1/30* (2013.01); *H01P 5/024* (2013.01); *H05K 9/0041* (2013.01)

(58) Field of Classification Search
CPC . H01P 3/127; H01P 1/30; H01P 3/121; H05K 9/006; H05K 9/007
USPC ............................................................ 333/1
See application file for complete search history.

(56) References Cited

U.S. PATENT DOCUMENTS

| | | | |
|---|---|---|---|
| 3,584,134 A | | 6/1971 | Nichols et al. |
| 5,401,914 A | * | 3/1995 | Curran ..................... H05K 9/00 174/383 |
| 5,690,306 A | * | 11/1997 | Roesner .................. G06F 1/184 248/222.52 |
| 5,928,076 A | | 7/1999 | Clements et al. |
| 6,252,161 B1 | | 6/2001 | Halley et al. |
| 6,671,186 B2 | | 12/2003 | Kopf |
| 7,135,644 B1 | | 11/2006 | Gilliland et al. |
| 2004/0233654 A1 | * | 11/2004 | Lin ....................... H05K 9/0041 361/818 |
| 2007/0297159 A1 | | 12/2007 | Gilliland |

FOREIGN PATENT DOCUMENTS

EP    0843512    10/1997

* cited by examiner

*Primary Examiner* — Benny T Lee
*Assistant Examiner* — Hafizur Rahman
(74) *Attorney, Agent, or Firm* — Hewlett Packard Enterprise Patent Department

(57) ABSTRACT

Examples described herein include an electromagnetic interference shield. In some examples, the electromagnetic interference shield includes a wall comprised of a conductive material. The wall may have a first surface, a second surface, and a thickness between the first surface and the second surface. The shield may include a rounded opening in the wall that creates an air passageway through the thickness of the wall. The shield may also include a first obstruction in the opening and a second obstruction in the opening. The first obstruction may span across the opening. The second obstruction may span across the opening and intersect the first obstruction. The first obstruction and the second obstruction may be waveguide structures.

19 Claims, 9 Drawing Sheets

WAVEGUIDE STRUCTURES

BACKGROUND

The performance of an electronic device may be affected by internal factors such as heat generated by the electronic device and by environmental factors such as interfering electromagnetic fields.

BRIEF DESCRIPTION OF THE DRAWINGS

The following detailed description references the drawings, wherein:

FIG. 100 illustrates a pictorial representation of obstructions in a waveguide structure, according to some examples.

DETAILED DESCRIPTION

Figure 1:
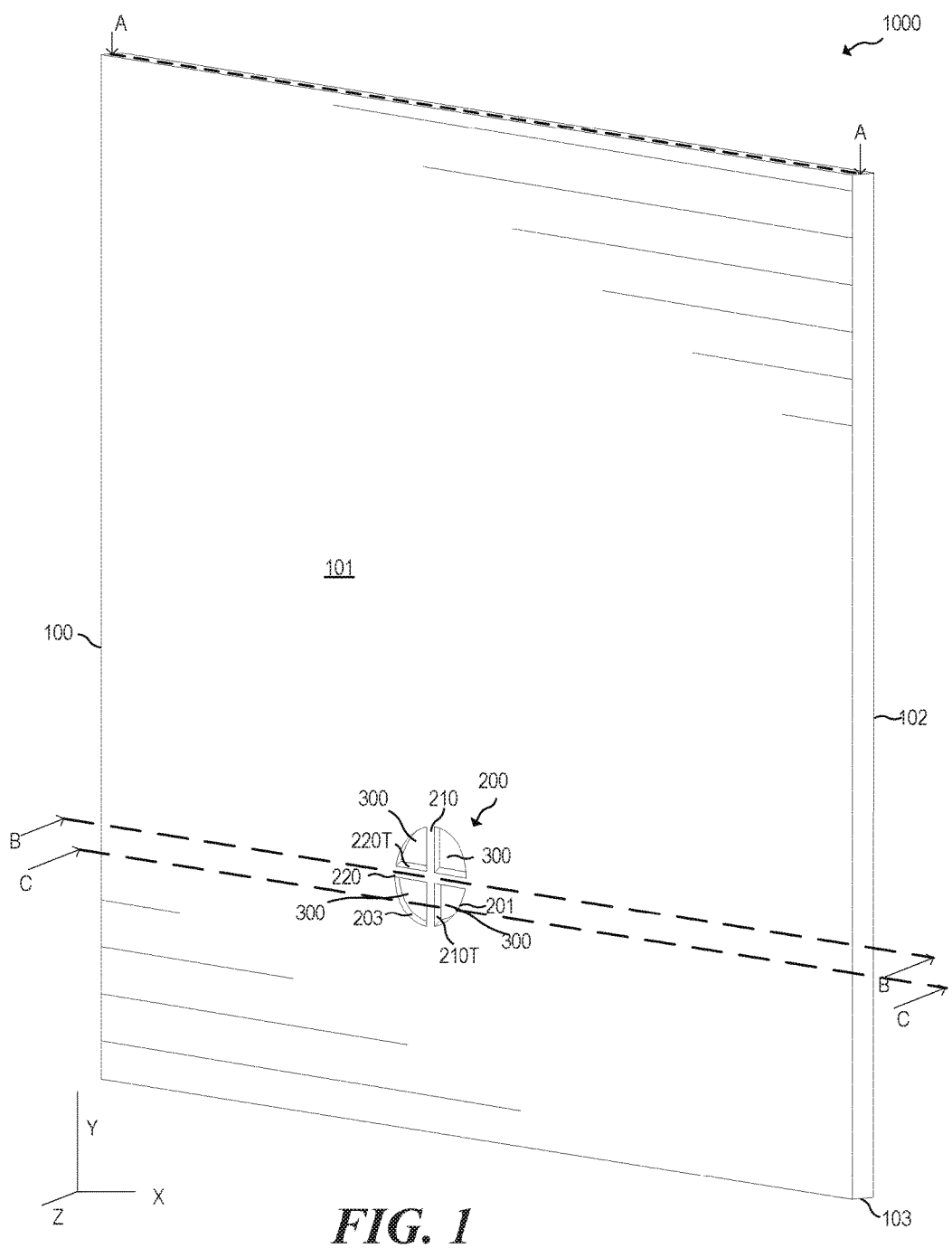
FIG. 1 illustrates a front perspective view of an electromagnetic interference shield with a waveguide structure, according to some examples.

In some situations, the housing of the electronic device may act as an electromagnetic interference (EMI) shield. The EMI shield protects the electronic device from electromagnetic fields in the environment and prevents the propagation of the electromagnetic field generated by the electronic device into the environment.

Additionally, in some situations, heat generated by an electronic device may be removed to increase the performance of the electronic device. The electronic device may be ventilated using holes placed in the housing of the electronic device. The holes allow air flow between the electronic device and the environment, mitigating the thermal retention of the device. In some situations, larger holes allow for more airflow and better thermal mitigation relative to smaller holes.

However, the presence of holes in an EMI shield may decrease the shielding ability of the EMI shield, as the holes allow for electromagnetic waves to propagate through the holes. This is specifically true with high frequency waves (5-40 GHz), which may propagate through the bigger holes used for thermal mitigation.

Examples discussed herein addresses these technological issues by allowing for bigger holes to be used in an EMI shield (e.g., for thermal mitigation purposes) without decreasing the shielding ability of the EMI shield. The openings disclosed herein may have two obstructions located in the openings. The placement of the obstructions in the opening and the thickness of the obstructions allow for the obstructions to act as waveguide structures and modal filters, increasing the cutoff frequency of the opening. Thus, examples discussed herein allow for the increase in an opening used as an air vent (to increase air flow) in an EMI shield without, at the same time, decreasing the shielding ability of the EMI shield.

In some examples, an electromagnetic interference shield is provided. The electromagnetic interference shield includes a wall, an opening in the wall, a first obstruction in the opening, and a second obstruction in the opening. In some examples, the wall is comprised of a conductive material, and has a first surface, a second surface, and a thickness between the first surface and the second surface. The opening creates an air passageway through the thickness of the wall. The first obstruction spans across the opening. The second obstruction spans across the opening and intersects the first obstruction. The first obstruction and the second obstruction are waveguide structures.

In some examples, an electromagnetic interference shield is provided with a wall comprised of a conductive material. The wall has a thickness. A waveguide structure extends through the thickness of the wall and includes a first opening, a second opening, an internal surface connecting the first opening and the second opening, a first bar extending on the internal surface from the first opening to the second opening, and a second bar extending on the internal surface from the first opening to the second opening. The internal surface comprises a curved portion. The second bar intersects the first bar.

In some examples, an electronic device is provided. The electronic device has an electromagnetic radiator, a housing comprised of a conductive material, and a first waveguide structure in the housing. In some examples, the housing encloses the electromagnetic radiator. In some examples, the first waveguide structure comprises a first circular perimeter, a second circular perimeter, an internal surface extending between the first circular perimeter and the second circular perimeter, and a cross extending along the internal surface.

Figure 2:
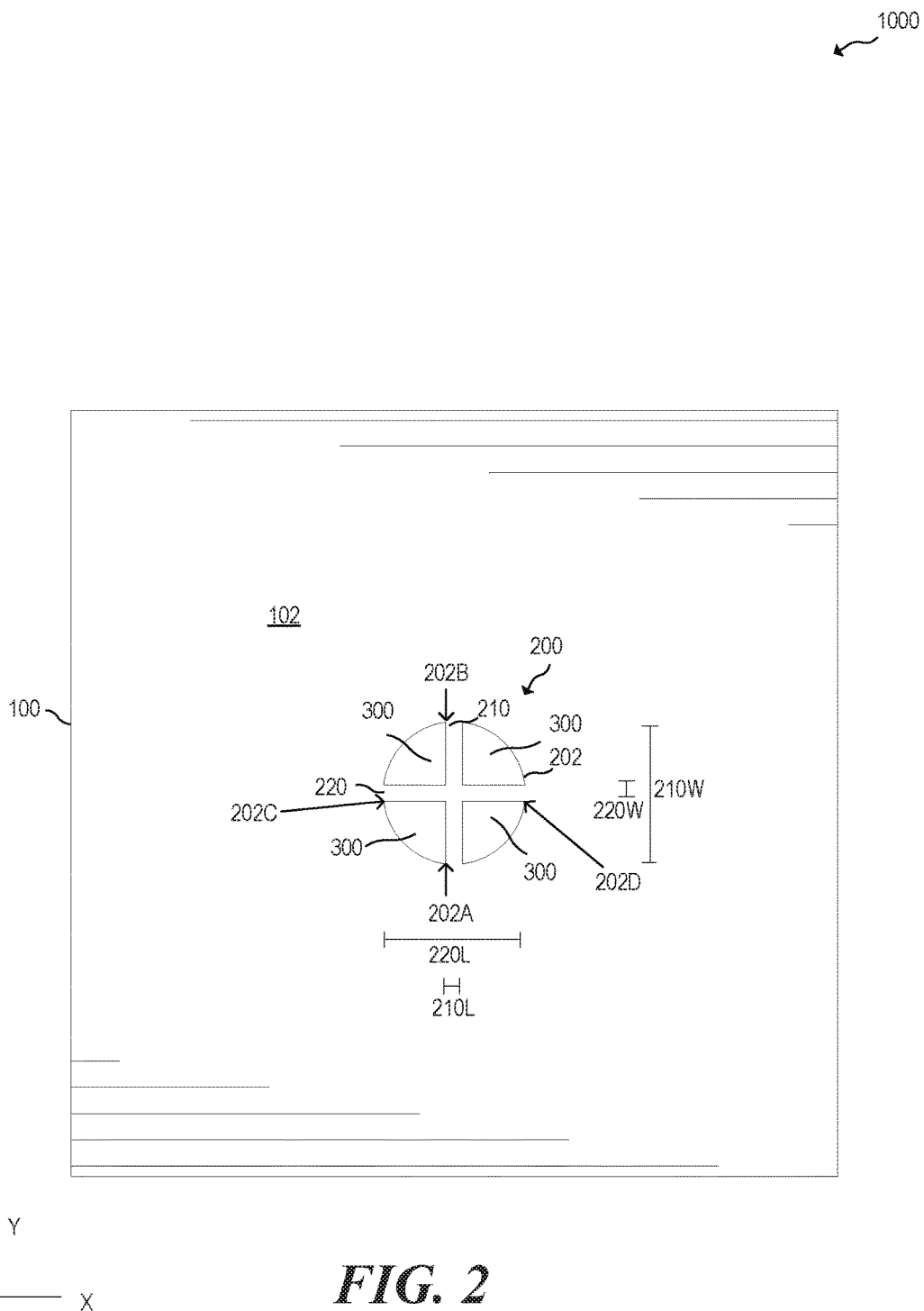
FIG. 2 illustrates a back view of the electromagnetic interference shield of FIG. 1, according to some examples.
Figure 4A:
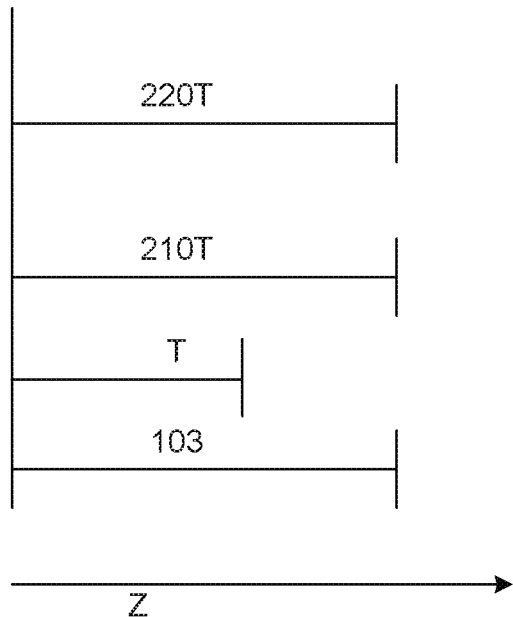
FIG. 4A illustrates a pictorial representation of a wall thickness in an electromagnetic interference shield, and equal obstruction thicknesses, according to some examples.
Figure 4B:
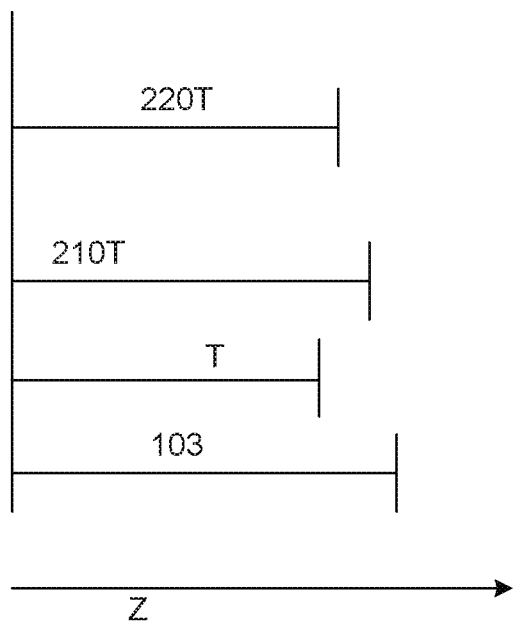
FIG. 4B illustrates a pictorial representation of a wall thickness in an electromagnetic interference shield, and unequal obstruction thicknesses, according to some examples.

Referring now to the figures, FIG. 1 illustrates a front perspective view of an electromagnetic interference shield 1000. FIG. 2 illustrates a back view of the electromagnetic interference shield 1000, and FIGS. 4A-4B illustrate various pictorial representations of wall thicknesses of electromagnetic interference shield 1000. Electromagnetic interference shield 1000 includes a wall 100 comprised of a conductive material 104. In some examples, conductive material 104 may include a metal (e.g., copper, aluminum, brass, steel, etc.), a metal electroplated with another type of metal (e.g., gold, silver, etc.), a metal finished with another type of metal, a non-conductive plastic plated or impregnated with conductive material, etc. In some examples, conductive material 104 is steel. Wall 100 may include other layers of material, and other materials not shown.

Wall 100 has a first surface 101, a second surface 102, and a thickness 103 that extends from first surface 101 to second surface 102. In some examples, thickness 103 characterizes the dimension of wall 100 along the Z-axis. In some examples, electromagnetic interference shield 1000 may prevent the propagation of electromagnetic fields from the environment interacting with first surface 101 to the environment interacting with second surface 102.

Figure 3A:
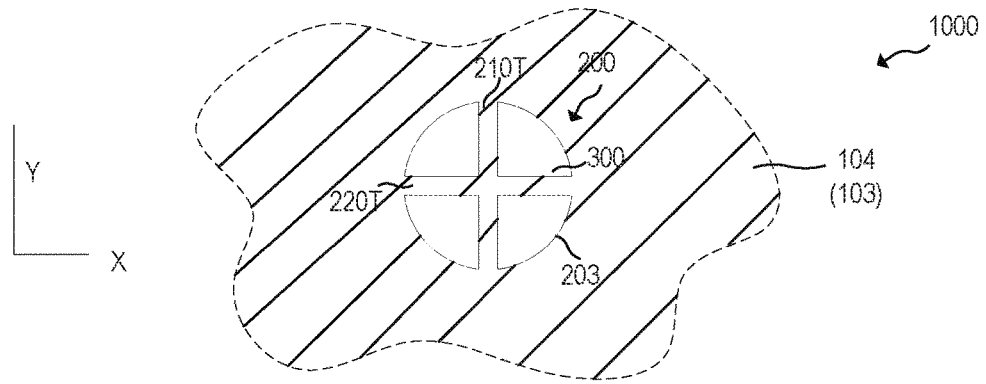
FIG. 3A illustrates a vertical cross sectional view of the electromagnetic interference shield of FIG. 1 at line A-A, according to some examples.
Figure 9A:
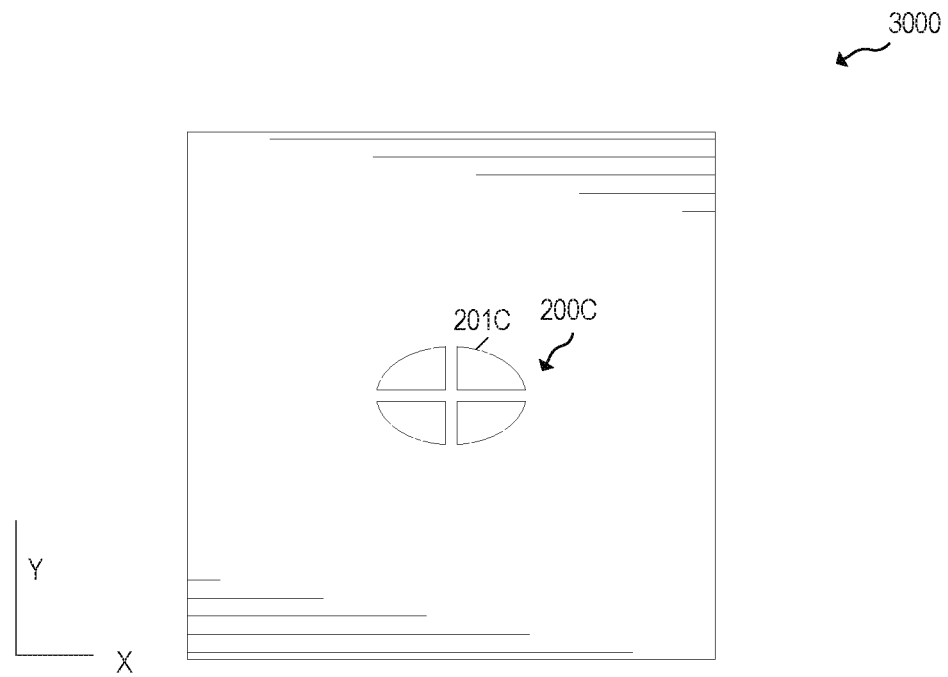
FIG. 9A illustrates an electromagnetic interference shield with an oval opening, according to some examples.
Figure 9B:
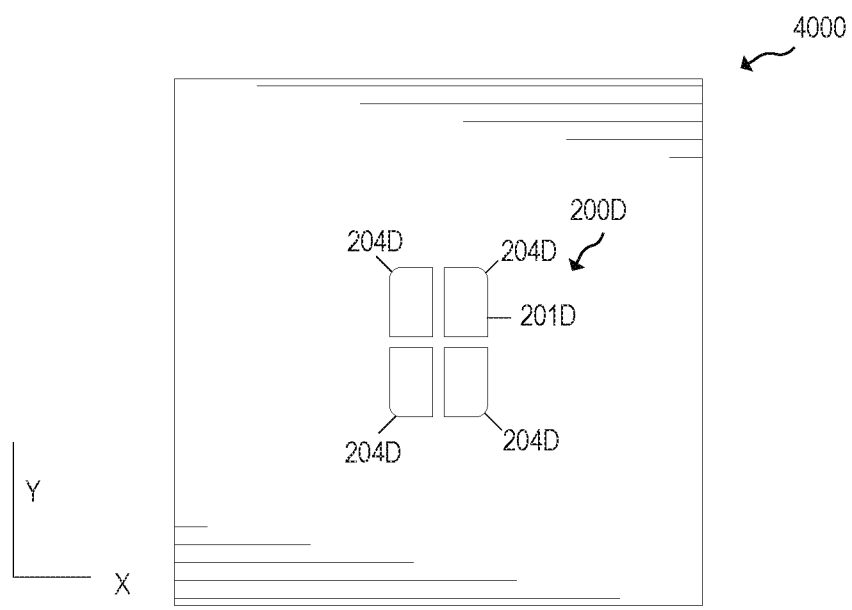
FIG. 9B illustrates an electromagnetic interference shield with a rounded rectangular opening, according to some examples.

An opening 200 is located in wall 100. In some examples, opening 200 is rounded. As understood herein, "rounded" includes shapes that are partially rounded (e.g., a portion of the shape is rounded, the shape is rounded throughout, etc.). In the example shown in FIG. 1, opening 200 has a circular vertical cross sectional shape. This is shown in FIG. 3A, which shows a vertical cross section of electromagnetic interference shield 1000 at line A-A. This is also shown in FIG. 2, which shows a back view of electromagnetic interference shield 1000. In other examples, opening 200 may have an oval cross sectional shape, as shown in FIG. 9A. "Rounded" also includes a shape that is partially rounded but has a straight (un-rounded) side. For example, a rectangle with rounded corners, as shown in FIG. 9B, may be considered "rounded" even though the sides that connect to the rounded corners are straight. In some examples where opening has some rounded portions, opening may include four sides or less. In some examples, opening 200 may be punched through the conductive material 104. In some examples, opening 200 may be extruded.

Referring back to FIG. 1, opening 200 may include a first perimeter 201. First perimeter 201 may be in the same vertical plane as first surface 101 of wall 100. First perimeter 201, like opening 200, may be rounded. In some examples, first perimeter 201 may be circular. In other examples, first perimeter may be oval or rounded rectangle.

Opening 200 may extend through thickness 103 of wall 100, creating a passageway 300 through wall 100. Passageway 300 may allow air to flow from the environment interacting with first surface 101 and the environment interacting with second surface 102. Passageway 300 may include an internal surface 203.

As illustrated in FIG. 2, opening 200 may include a second perimeter 202. Second perimeter 202 may be in the same vertical plane of second surface 102 of wall 100. As shown in FIG. 1, internal surface 203 connects first perimeter 201 to second perimeter 202. Second perimeter 202, like opening 200, may be rounded. In some examples, second perimeter 202 is circular. In other examples, second perimeter 202 may be oval or a rounded rectangle.

In some examples, perimeter 201 and perimeter 202 have similar shapes and passageway 300 retains a similar shape as perimeter 201 throughout passageway's extension across thickness 103. This is shown in FIG. 3A, which illustrates a vertical cross section along line A-A of FIG. 1. Thus, in some examples, internal surface 203 may have vertical cross sections that are similar to the shape of perimeters 201 and 202. Additionally, internal surface 203 may be curved or include curved portions. For example, in the example of FIG. 1, first perimeter 101 is circular, thus, internal surface is curved with circular vertical cross sections.

Referring back to FIG. 1, electromagnetic interference shield 1000 may also include a first obstruction 210 in opening 200. In some examples, electromagnetic interference shield 1000 may include a second obstruction 220 in opening 200. First obstruction 210 may have a thickness 210T that is measured along the Z-axis as specified in FIG. 1. Second obstruction 220 may have a thickness 220T that is measured along the Z-axis as specified in FIG. 1. In some examples, first obstruction 210 and second obstruction 220 are also comprised of a conductive material. In some examples, the conductive material is similar to the conductive material is discussed above. In some examples, the first obstruction and the second obstruction may be made through punching the obstructions through sheet metal.

In some examples, first obstruction 210 spans across opening 200 such that first obstruction connects one end of first perimeter (or second perimeter) to the opposite end of the same perimeter. This is shown in FIG. 2, which illustrates a back view of electromagnetic interference shield 1000. As shown in FIG. 2, first obstruction connects end 202B of perimeter 202 to opposite end 202A. Additionally, first obstruction may extend from one end of a vertical cross section of passageway 300 to another end of the same vertical cross section of passageway 300. This is also shown in FIG. 3A, which illustrates a vertical cross sectional view of electromagnetic interference shield 1000 at line A-A in FIG. 1. In some examples, second obstruction 220 also spans across opening 200 in a similar manner but at different locations of passageway 300 or perimeter. For example, in FIG. 2, second obstruction 220 connects end 202O of second perimeter 202 to opposite end 202D of second perimeter 202.

In some examples, and as shown in FIG. 2, first obstruction is placed in a location in opening such that it bisects opening 200 (i.e. cuts passageway 300 in half) along an axis. In some examples, second obstruction is placed in a location in opening such that it bisects opening 200 along a different axis. For example, in FIG. 2, first obstruction 210 bisects opening 200 along a vertical axis while second obstruction 220 bisects opening 200 along a horizontal axis.

As also shown in FIG. 2, first obstruction has a length 210L and a width 210W. Length, as understood herein, is the dimension measured along the X-axis. Width, as understood herein, is the dimension measured along the Y-axis as specified in FIG. 1. Second obstruction 220 may have a length 220L and a width 220W.

Figure 10A:
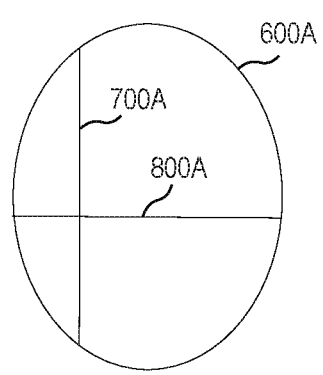
FIG. 10A illustrates a pictorial representation of obstructions in a waveguide structure, according to some examples.

Thus, in the examples of FIGS. 1-2, 3A-3C, the width 210W of first obstruction 210 and the length 220L of second obstruction 220 are equal to the cross sectional diameter of passageway 300 because first obstruction 210 bisects opening 200 and second obstruction bisects opening 200. However, in other examples, first obstruction 210 and second obstruction 220 may span across opening 200 but do not bisect opening 200. In these examples, width 210W and length 220L may be different than the diameter of a cross sectional diameter of passageway 300. This is shown in FIG. 10A.

In some examples, second obstruction 220 and first obstruction 210 intersect each other. In some examples, and as shown in FIG. 1, first obstruction 210 bisects second obstruction 220 and second obstruction 220 bisects first obstruction 210. In other examples, first obstruction or second obstruction may intersect each other at any location along their lengths. This is shown in FIG. 10A. Thus, in some examples, first obstruction 210 and second obstruction 220 may together divide opening 200 into four quadrants of equal or unequal proportions.

Figure 3B:
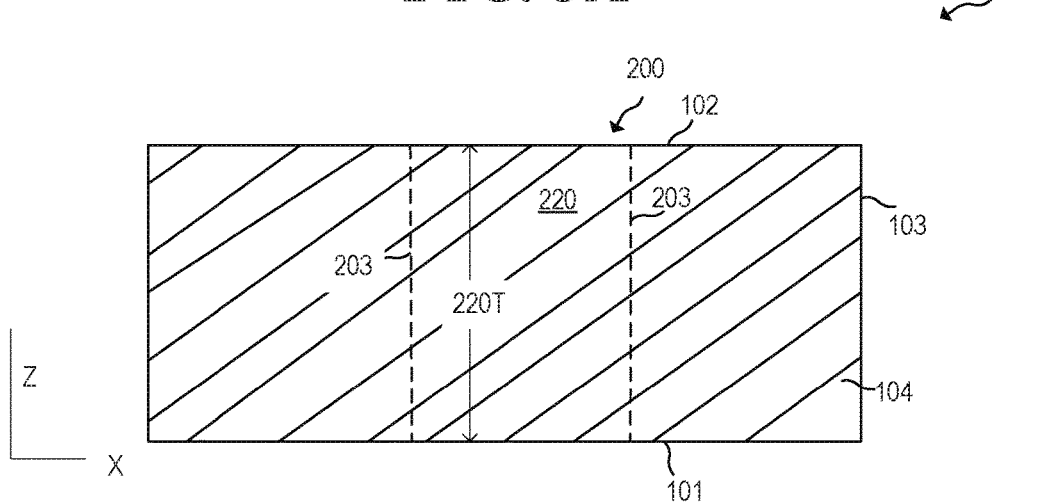
FIG. 3B illustrates a horizontal cross sectional view of the electromagnetic interference shield of FIG. 1, at line B-B, according to some examples.

In some examples, first obstruction 210 and second obstruction 220 are bars that extend along the internal surface 203 of passageway 300. The extension of the first obstruction and second obstruction along the internal surface 203 of passageway 300 may also be characterized as the obstructions directly touching the internal surface along the obstructions' thickness. This is shown in FIG. 3B, which illustrates a horizontal cross section along line B-B of FIG. 1. FIG. 3B illustrates the horizontal cross section in the middle of second obstruction 220. As shown in FIG. 3B, second obstruction 220 extends along the internal surface 203 of passageway 300, touching the internal surface 203 as second obstruction extends. First obstruction 210 is not seen in the illustration of FIG. 3B, as it is obstructed by second obstruction 220. The distance of extension of each obstruction along the internal surface 203 of passageway 300 directly translates to the thickness of the obstructions.

As discussed above, a hole may hinder the shielding ability of an electromagnetic shield because waves may propagate through the hole. However, opening 200 does not hinder the shielding capabilities of electromagnetic interference shield 1000 because first obstruction 210 and second obstruction 220 (together with passageway 300) function as a waveguide to filter out which waves may propagate through opening 200.

A waveguide is a physical structure that guides electromagnetic waves between two endpoints of its physical structure. A waveguide transmits electromagnetic waves above a specific cutoff frequency and reflects or attenuates electromagnetic waves below the specific cutoff frequency. In other words, a cutoff frequency of a waveguide is the lowest frequency that may propagate through a waveguide. Thus, opening 200, passageway 300, first obstruction 210, and second obstruction 220 may attenuate electromagnetic waves below a specific cutoff frequency, thus limiting the propagation of waves as compared to a hole without first and second obstructions.

A "waveguide structure", as understood herein, may include any structure that that blocks electromagnetic radiation below a specified frequency and any portion of that structure that contributes to the block. Thus, opening 200, together with first obstruction 210, second obstruction 220, and passageway 300 may be characterized as a waveguide structure. Additionally, first obstruction 210, second obstruction 220, opening 200, and passageway 300 individually may be also be characterized as waveguide structures.

One attribute of a waveguide structure is its ability to attenuate waveguides. This attribute translates to the dimension of the waveguide structure along the direction of the wave propagation. In other words, the dimension of the waveguide structure from one end of its physical structure to the other end of its physical structure may affect its ability to attenuate waveguide (i.e. act as a waveguide).

In the examples discussed herein, opening 200 may propagate waves along the Z axis (i.e. from the environment surrounding first surface 101 to environment surrounding second surface 102). Thus, thickness 103 of wall 100 (i.e. thickness of passageway 300), thickness 210T of first obstruction 210, and thickness 220T of second obstruction 220 contribute to the dimensions of the waveguide structure along this axis.

In some examples, and as shown in the examples of FIGS. 1, 2, and 3A-3C, thickness 103 of wall 100, thickness 210T, and thickness 220T are equal to each other. Thus, first obstruction 210 and second obstruction 220 begin on the same vertical plane as first surface 101, extend along passageway 300, and end on the same vertical plane as second surface 102.

Figure 3C:
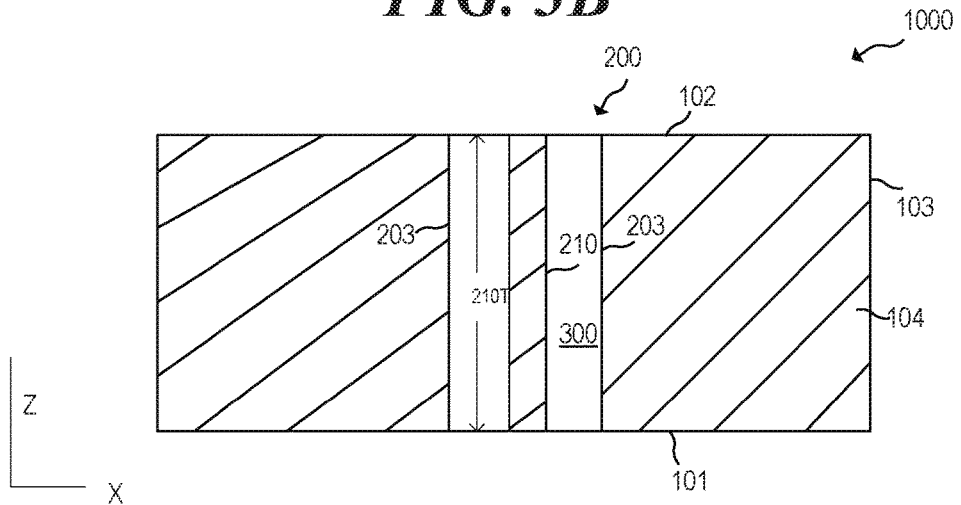
FIG. 3C illustrates a horizontal cross sectional view of the electromagnetic interference shield of FIG. 1, at line C-C, according to some examples.

FIGS. 3A-3C show detailed views of thicknesses 103, 220T, and 210T. FIG. 3A illustrates a vertical cross section of electromagnetic interference shield 1000 of FIG. 1 at line A-A. Thus FIG. 3A shows the Y-X axis and not the Z axis. Because thicknesses 210T and 220T are equal to thickness 103, first obstruction 210 and second obstruction 220 are visible at the vertical cross section shown in FIG. 3A. Additionally, because thickness 210T and thickness 220T extend along the entirety of passageway 300 and because first obstruction and second obstruction span opening 200 (as discussed above), first obstruction 210 and second obstruction 220 directly touch internal surface 203. In some examples, and as shown in FIGS. 3A-3C, the material of obstructions 210 and 220 are similar to material of wall 100. Thus, FIGS. 3A-3C show the cross sectional area of obstructions 210 and 220 with the same style of shading as cross sectional area of thickness 103. In other examples, material of obstructions 210 and 220 may be different from material of wall 100.

FIG. 3B illustrates a horizontal cross sectional view of electromagnetic interference shield 1000 of FIG. 1 at line B-B. Thus FIG. 3B shows the Z-X axis and not the Y axis. As shown in FIG. 3B, second obstruction 220 extends from the plane of first surface 101 to the plane of second surface 102 with a thickness 220T similar to thickness 103. Additionally, second obstruction 220 directly touches internal surface 203 as it extends along the passageway 300. As discussed above, in some examples, the material of wall 100 may be the same as the material of obstructions 210 and 220. Because second obstruction 220 directly touches internal surface 203 as it extends along the passageway 300, lines 203 in FIG. 3B are shown as being dotted. However, in other examples, material of obstructions 210 and 220 may be different from material of wall 100 and lines 203 may be represented as solid lines. Passageway 300 and first obstruction 210 are not visible this view because they are blocked by second obstruction 220.

FIG. 3C illustrates a horizontal cross sectional view of electromagnetic interference shield 1000 at line C-C of FIG. 1. Thus FIG. 3C shows the Z-X axis and not the Y axis. As shown in FIG. 3C, first obstruction 210 extends from the plane of first surface 101 to the plane of second surface 102 with thickness 210T that is similar to thickness 103. First obstruction 210 is not shown as touching internal surface 203 in this view because first obstruction 210 does not touch internal surface 203 at the horizontal plane represented by line C-C of FIG. 1. FIG. 3C shows length 210L of first obstruction 210 as being thinner than thickness 103. However, in other examples, length 210L of first obstruction may be equal to thickness 103.

In these examples, thicknesses 103, 210T, and 220T are equal to or greater than a threshold thickness, T. FIG. 4A illustrates a pictorial representation of this relationship.

The threshold thickness T characterizes a minimum length of one end of a structure to the other end of the structure for the structure to be a waveguide. Because passageway 300, first obstruction 210, and second obstruction 220 are individual portions of the waveguide structure, the thicknesses of each portion contributes to the function of the waveguide structure. For example, a structure in which thickness 103 of wall 100 was sufficiently thick (equal to or greater than T), but in which either first obstruction 210, or second obstruction 220 were not sufficiently thick, would not act as a waveguide structure as described herein. Rather, passageway 300 would alone act as the waveguide structure and first obstruction 210 and second obstruction 220 would act as scatterers. In other words, first obstruction 210 and second obstruction 220 in those examples would not be characterized as waveguide structures. Additionally, opening 200 would not be able to filter out the frequencies as described herein. In some examples, threshold thickness T may be ≤2 mm. In some examples, threshold thickness T may be larger than 2 mm. However, a threshold thicknesses T that is larger than 2 mm may decrease venting abilities of the opening 200.

In other examples, thickness 103, thickness 210T, and thickness 220T are different. In other words, thickness 103 is larger than thickness 210T and/or larger than thickness 220T.

In some examples where the thicknesses are different, first obstruction 210 (or second obstruction 220) may begin on the same vertical plane as either first surface 101 or second surface 102, extend along a portion of passageway 300, and end inside passageway 300. In these examples, thickness 210T and thickness 220T are equal to or greater than the threshold thickness T as discussed above to be utilized as waveguide structures. FIG. 4B illustrates a pictorial representation of this relationship. A structure in which either thickness 210T or thickness 220T is not equal to or greater than the threshold thickness T would not as a waveguide structure as described herein. Rather, passageway 300 would alone act as the waveguide structure and first obstruction 210 and second obstruction 220 would act as scatterers. In other words, first obstruction 210 and second obstruction 220 in those examples would not be characterized as waveguide structures, as described herein.

Figure 5A:
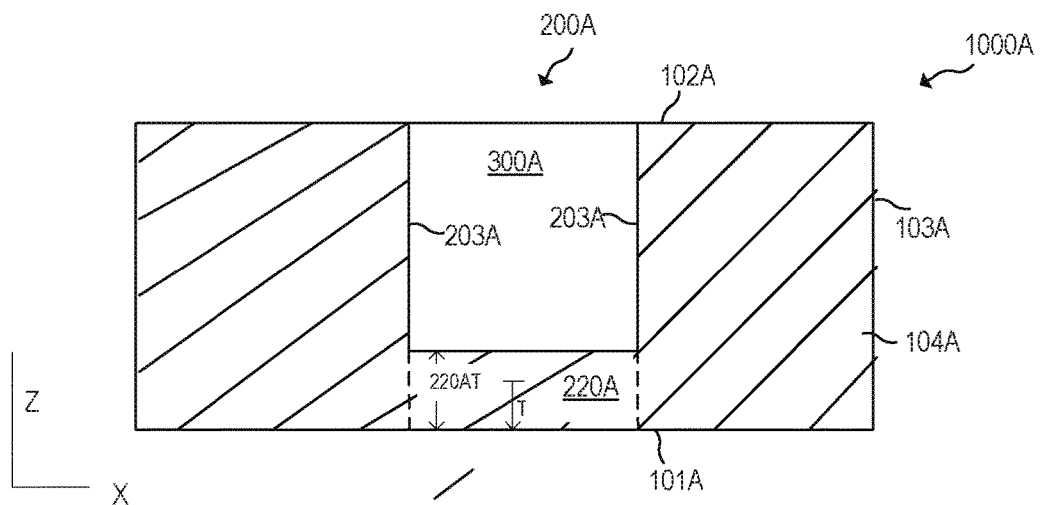
FIG. 5A illustrates a horizontal cross sectional view of an electromagnetic interference shield with a second obstruction that is thinner than a wall thickness, according to some examples
Figure 5B:
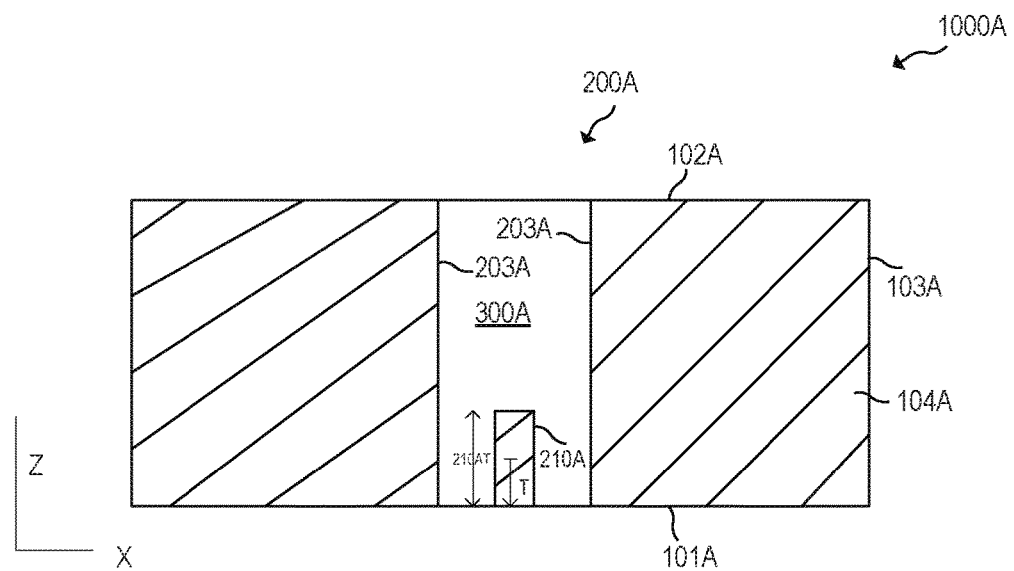
FIG. 5B illustrates a horizontal cross sectional view of an electromagnetic interference shield with a first obstruction that is thinner than a wall thickness, according to some examples.

FIGS. 5A-5B illustrate examples of an electromagnetic interference shield 1000A with opening 200A. Electromagnetic interference shield 1000A is similar to electromagnetic interference shield 1000. Opening 200A is similar to opening 200 in every aspect except that, in opening 200A, first obstruction 210A and second obstruction 220A start on the same vertical plane as first surface 101A and end inside passageway 300A. FIG. 5A illustrates a horizontal cross section of electromagnetic interference shield 1000A at the same location as line B-B in FIG. 1. As shown in FIG. 5A, thickness 220AT of second obstruction 220A is greater than threshold thickness T. FIG. 5B illustrates a horizontal cross section of electromagnetic interference shield 1000A at the same location as line C-C in FIG. 1. As shown in FIG. 5B, thickness 210AT of first obstruction 210A is greater than threshold thickness T.

Figure 6A:
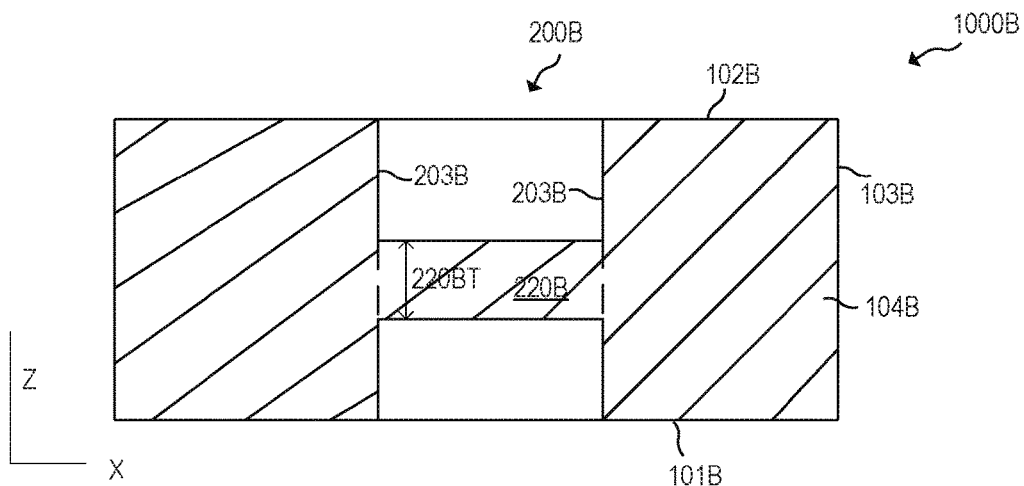
FIG. 6A illustrates a horizontal cross sectional view of an electromagnetic interference shield with a second obstruction that does not begin on the same vertical plane as a wall of the electromagnetic interference shield, according to some examples.
Figure 6B:
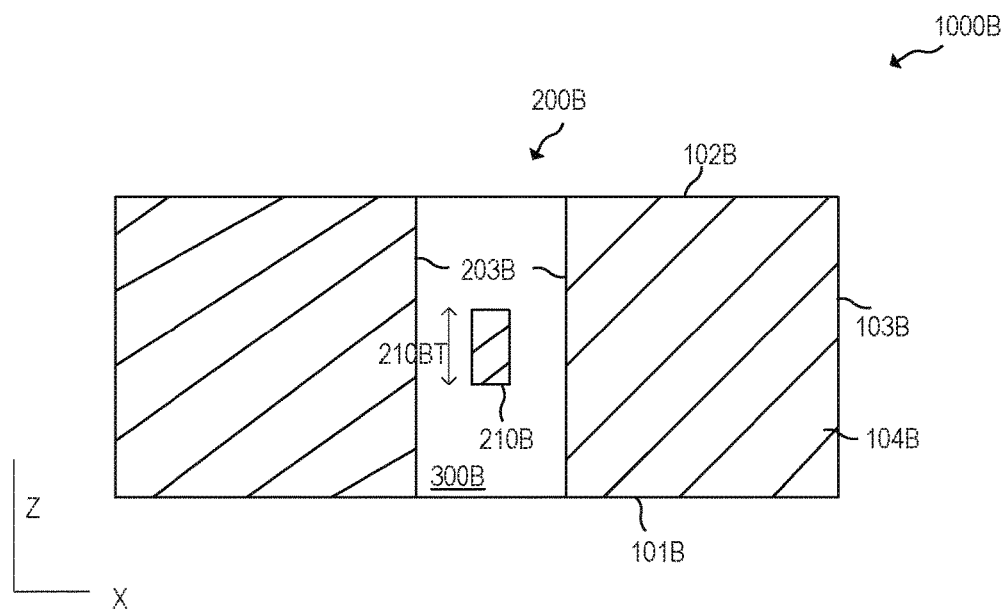
FIG. 6B illustrates a horizontal cross sectional view of an electromagnetic interference shield with a first obstruction that does not begin on the same vertical plane as a wall of the electromagnetic interference shield, according to some examples.

In other examples where the thicknesses are different, first obstruction 210 (and/or second obstruction 220) may start inside passageway 300, extend along a portion of passageway 300, and end inside passageway 300. This is illustrated in FIGS. 6A and 6B with electromagnetic interference shield 1000B and opening 200B. Electromagnetic interference shield 1000B is similar to electromagnetic interference shield 1000. Opening 200E is similar to opening 200 in every aspect except for first obstruction 210E and second obstruction 220B.

FIG. 6A illustrates a horizontal cross section of electromagnetic interference shield 1000B at the same location as line B-B in FIG. 1. As shown in FIG. 6A, second obstruction 220B does not reach either the vertical plane of first surface 101B or the vertical plane of second surface 102B. Rather, second obstruction 220B begins inside of passageway 300B and ends inside of passageway 300B, having a thickness 220BT. FIG. 6B illustrates a horizontal cross section of electromagnetic shield 1000E at the same location as line C-C in FIG. 1. As shown in FIG. 6B, first obstruction 210B does not reach either the vertical plane of first surface 101B or the vertical plane of second surface 102B. Rather, first obstruction 210B begins inside of passageway 300B and ends inside of passageway 300B, having a thickness 210BT.

In these examples, the waveguide function of thicknesses of first obstruction 210 and second obstruction 220 are not limited by the threshold thickness T, as described above. In other words, thicknesses 210T and 220T may be smaller than, equal to, or bigger than threshold T and still act as waveguide structures. For example, first obstruction 210 and second obstruction may have a thickness of less than 1 mm. This difference is because of the placement of the first obstructions and the second obstructions inside passageway 300B rather than at the beginning of passageway 300B. Thus, in some examples, placement of the obstructions along the Z-axis may also contribute to the waveguide capabilities of the structures. In some examples, the placement of the obstructions inside the passageway allows for increased venting abilities of the opening.

Yet another attribute of a waveguide structure is its cutoff frequency.

In some examples, the cutoff frequency of a waveguide may further depend on the modal filtering abilities of the waveguide.

This is because electromagnetic fields may propagate through a waveguide in different modes having different transverse field distributions. A specific waveguide may allow the propagation of various modes, with one mode being the dominant mode. The dominant mode of a waveguide may be altered by the shape of the passageway.

Thus, in some examples, the cutoff frequency of a waveguide correlates to the shape that is made by the intersection of the first obstruction 210 and second obstruction 220.

For example, the dominant mode that may propagate through a waveguide with a simple circular passageway is the $TE_{11}$ mode. Because first obstruction 210 and second obstruction 220 block portions of opening 200 in the described manner (e.g., intersecting each other, bisecting each other, etc.), the dominant mode that may propagate through the waveguide structure in examples disclosed herein is not the $TE_{11}$ mode, but rather the $TE_{21}$ mode.

Thus, first obstruction 210 and second obstruction 220 may act as a modal filter to filter out certain modes from propagating. For example, first obstruction 210 and second obstruction 220 may also filter the $TM_{01}$ mode. Because the cutoff frequency for each mode is different, and $TE_{21}$ has higher cutoff frequency than $TE_{11}$ and $TM_{01}$ for a specific opening, the intersecting shape (e.g., cross) that is made by first obstruction 210 and second obstruction 220 increases the cutoff frequency of the waveguide structure of the opening 200 as compared to a circular passageway without the first obstruction and second obstruction.

For example, the cutoff frequency for the $TE_{21}$ mode of a circular waveguide structure may be represented by the equation:

$$F = \frac{3.0542c}{2\pi r} \quad (Eq\ 1)$$

where c is the speed of light within the waveguide in meters per second, r is the largest dimension in meters, and F is the frequency in Hz.

The cutoff frequency for the $TE_{11}$ mode of a circular waveguide structure may be represented by the equation:

$$F = \frac{1.8412c}{2\pi r} \quad (Eq\ 2)$$

And the cutoff frequency for the $TM_{01}$ mode of a circular waveguide structure may be represented by the equation:

$$F = \frac{2.4048c}{2\pi r} \quad (Eq\ 3)$$

As represented by Eq1, Eq2, and Eq3, the cutoff frequency for the $TE_{21}$ mode is higher than the cutoff frequencies for the $TM_{01}$ and $TE_{11}$ modes for a similar opening. While Eq1, Eq2, and Eq3 show equations for circular waveguides, the relationship between the three different modes is similar in other shaped waveguides, such as oval waveguides, etc.

Thus, obstructions 210 and 220 thus may increase the cutoff frequency of opening 200 by acting a modal filter to filter out the $TM_{01}$ mode and the $TE_{11}$ mode. In some examples, this is because the shape formed by the intersection of first obstruction 210 and second obstruction 220 interrupts the field distributions of the $TM_{01}$ mode and the $TE_{11}$ modes. Thus, the vertical cross sectional shape (sliced along the Z axis, showing the Y and X axis) of first obstruction and second obstruction may affect the cutoff frequency of opening 200.

Additionally, as shown in Eq. 1, the dimensions of the first perimeter 201, second perimeter 202, first obstruction 210, and second obstruction 220 may also affect the cutoff frequency.

For example, an increase in the length 210L of first obstruction 210 and increase in width 220W of second obstruction 220 may decrease the largest dimension in opening 200, thus increasing the cutoff frequency of the waveguide structure. Using equation Eq1 and a specific cutoff frequency, the width or length of first obstruction 210, width or length of second obstruction 220, and dimensions of opening 200 may be determined. In some examples, the cutoff frequency of waveguide structure including the first obstruction 210, second obstruction 220, opening 200, and passageway 300 is at least 5 GHz, at least 10 GHz, at least 15 GHz, at least 20 GHz, at least 25 GHz, at least 30 GHz, at least 40 GHz (e.g., 13 GHz, 25 GHz, etc.).

Thus, in some examples, a wider second obstruction 220 and a longer first obstruction 210 may allow for better EMI shielding as compared to a thinner second obstruction and a shorter first obstruction. However, the cutoff frequency and waveguide attributes of the waveguide structure may not be the only consideration for the shape and dimensions of first obstruction, second obstruction, and opening. This is because, in some examples, opening 200 and passageway 300 may be used for ventilation and thermal mitigation. Thus, the airflow of passageway 300 may also be a consideration in determining the dimensions of first obstruction and second obstruction.

Figure 7:
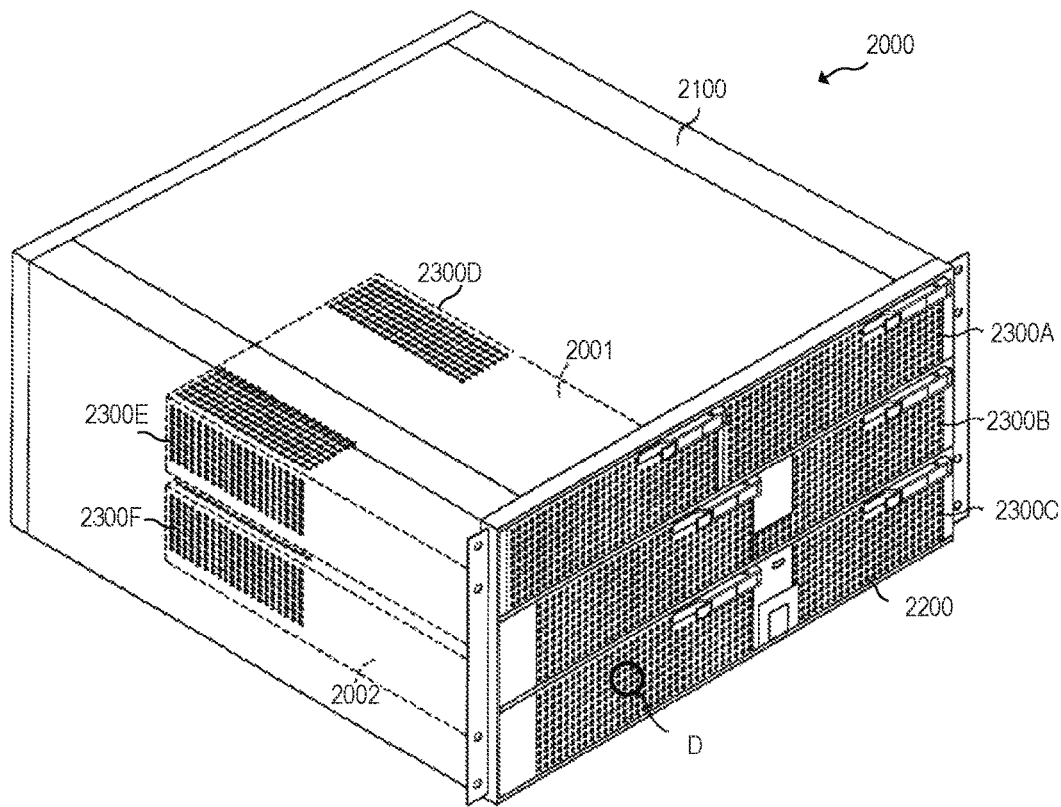
FIG. 7 illustrates an electronic device, according to some examples.

Referring now to FIG. 7, an electronic device 2000 is provided. Electronic device, as used herein, may include any device with an electrical component. Non-limiting examples include a DVD player, a server, a printer head, a cell phone, a TV, etc. Electronic device 2000 may include an electromagnetic radiator 2001 that is at least partially enclosed by housing 2100. Electromagnetic radiator may include, in some non-limiting examples, a processing resource, electronic circuitry, disk drive, etc. In some examples, electronic device 200 may include at least two electromagnetic radiators (e.g., electromagnetic radiator 2001, electromagnetic radiator 2002, etc.) Housing 2100 may be comprised of a conductive material, as discussed in relation to wall 100. The electronic device may also at least one portion 2300 that a first waveguide structure 2200.

First waveguide structure 2200 may be similar to opening 200, opening 200B, opening 2000 as discussed above. Thus, in some examples, waveguide structure 2200 may include a first circular perimeter, a second circular perimeter, an internal surface extending between the first circular perimeter and the second circular perimeter, and a cross extending along the internal surface. First circular perimeter is similar to first perimeter 201, second circular perimeter is similar to second perimeter 202, and internal surface is similar to internal surface 203. Additionally, cross may have similar characteristics as first obstruction 210 and second obstruction 220, as discussed above.

In some examples, housing 2100 may include a plurality of portions 2300A, 2300B, 2300C, 2300D, 2300E, 2300F with each portion having a plurality of waveguide structures 2200, as shown in FIG. 7. In some examples, these portions may be adjacent to electrical radiators, or other heat-generating component of electronic device 2000.

Waveguide structure 2200 may act as ventilation holes allowing heat generated by electrical component or electromagnetic radiators in electronic device 2000 to escape. Thus, in electronic device 2000, waveguide structure 2200 acts as both a waveguide (electromagnetic wave attenuator) and as an air passageway.

As discussed above, the ability of waveguide structure 2200 to attenuate electromagnetic waves increases as the dimensions of the first obstruction and second obstruction increases. However, the ability of waveguide structure 2200 to mitigate thermal retention decreases as the dimensions of the first obstruction and the second obstruction increases.

In some examples, one way to achieve a balance between these two competing functions is to have a certain relationship between the cross-sectional area of the waveguide structure 2200 and the cross-sectional area of the first and second obstructions.

In some examples, the first obstruction and the second obstruction of waveguide structure 2200 may have a total vertical cross-sectional area. The vertical cross-section may be taken at the same plane at which the first obstruction and the second obstruction begins. The passageway also has a cross sectional area at the same vertical cross section. The cross sectional area of the passageway includes areas that are blocked (obstructed) by the obstructions and areas that are not blocked by obstructions. For example, if the passageway is circular (like the examples of FIG. 3A), the cross section of the passageway may be determined by taking the radius of the circle and calculating the area of the circle using the radius. In some examples, the total obstruction cross-sectional area is equal to or less than 25% of the cross sectional area of the passageway. In other examples, the total obstruction cross-sectional area is equal to or less than 20% of the cross sectional area of the passageway.

In some examples, one way to achieve a balance between the two competing functions is have a certain relationship between the width of an obstruction in a waveguide structure 2200A and the distance of that waveguide structure 2200A to another waveguide structure 2200B.

Figure 8:
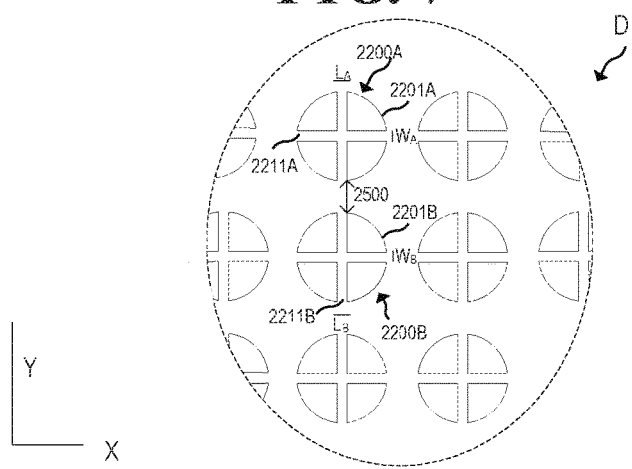
FIG. 8 illustrates a close-up view of the electronic device of FIG. 7, according to some examples.

FIG. 8 depicts this relationship. FIG. 8 is a close-up view of area D in FIG. 7 and shows a plurality of waveguide structures, including waveguide structure 2200A and waveguide structure 2200B. Waveguide structure 2200A may include a first perimeter 2201A, a second perimeter 2202A (not shown in FIG. 8), a first internal surface connecting the first perimeter and the second perimeter (not shown in FIG. 8), and a first cross 2211A extending along the internal surface.

Waveguide structure 2200B may include a third perimeter 2201B, a fourth perimeter 2202B (not shown), a second internal surface connecting the third perimeter and the fourth perimeter (not shown), and a second cross 2211B extending along the internal surface. In some examples, a width $W_A$ of the first cross 2211A is smaller than a distance 2500 between the first perimeter 2201A and the third perimeter 2201B. In some examples, a width $W_B$ of the second cross 2211B is also smaller than distance 2500 between the first perimeter 2201A and the third perimeter 2201B. In some examples, a length $L_A$ of the first cross 2211A is smaller than distance 2500 between the first perimeter 2201A and the third perimeter 2201B. In some examples, a length $L_B$ of the second cross 2211B is also smaller than distance 2500 between the first perimeter 2201A and the third perimeter 2201B. In some examples, distance 2500 is measured by determining the shortest straight line from first perimeter 2201A to third perimeter 2201B.

The waveguide structures disclosed herein may significantly decrease an electromagnetic shielding function. In some examples, the structures disclosed herein allow for increased shielding of high frequencies (5 GHz-40 GHz). In an example, a circular hole with a 14 mm diameter with first obstruction having a length 210L of 1.5 mm and second obstruction having a width of 220W of 1.5 mm in the hole decreased electromagnetic fields at 13 GHz by more than 20 dB as compared to a hole with a 14 mm diameter without the obstructions. Additionally, waveguide structures having the relationships described above may allow for a balance between thermal mitigation and EMI shielding. In other words, the obstructions in these waveguide structures are sized such that they are small enough to allow for airflow but are big enough to allow for electromagnetic attenuation.

While FIGS. 1-8 illustrate openings with circular perimeters, other rounded perimeters may also be used with opening. For example, FIG. 9A illustrates an electromagnetic interference shield 3000 with opening 2000 having an oval first perimeter 2010. Accordingly, an internal surface of opening 2000 may be curved with oval vertical cross sections. As yet another example, FIG. 9B illustrates an electromagnetic interference shield 4000 with opening 200D having a rectangle perimeter 201D with curved or rounded corners 204D. Thus, an internal surface of opening 200D may have straight portions and curved portions.

Also, while FIGS. 1-8 show first obstruction and second obstruction as bisecting each other and opening, in some examples, first obstruction and second obstruction may be placed such that they intersect each other at other locations. FIG. 10A shows a simplified representation of opening 600A and obstructions 700A and 800A. In FIG. 10A, obstructions are represented by a single line and the widths and lengths of the obstructions are not shown.

Figure 10B:
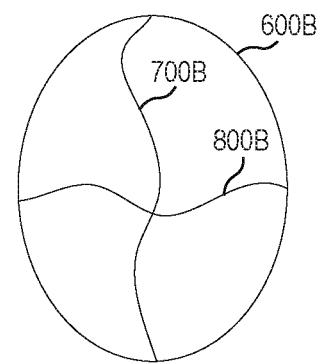
FIG. 10B illustrates a pictorial representation of obstructions in a waveguide structure, according to some examples.
Figure 10C:
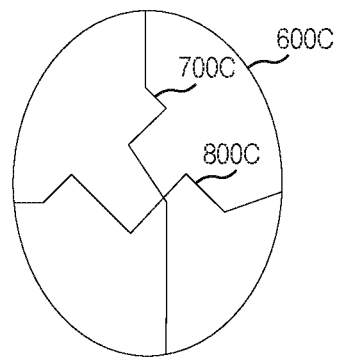

Additionally, while FIGS. 1-96 illustrate first obstruction and second obstruction as having linear edges, first obstruction and second obstructions may have curved edges. FIGS. 10B-10C show simplified representations of other openings and obstructions. In FIGS. 10B-10C, obstructions are represented by a single line and the widths and lengths of the obstructions are not shown. FIG. 10B shows an opening 600B with a first obstruction 700B and a second obstruction 800B. First obstruction 700B is curved. Second obstruction 800B is also curved. FIG. 10C shows an opening 6000 with a first obstruction 7000 and a second obstruction 8000. First obstruction 7000 and second obstruction 800C have zig-zag edges. While FIGS. 10B and 10C show obstructions with non-linear edges, the obstructions still maintain the cross-like intersection, allowing them to have modal filtering characteristics as discussed above.

All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. An electromagnetic interference shield comprising:
    a wall comprised of a conductive material, the wall having a first surface, a second surface, and a thickness between the first surface and the second surface;
    a rounded opening in the wall, the opening creating an air passageway through the thickness of the wall;
    a first obstruction in the opening, the first obstruction spanning across the opening; and
    a second obstruction in the opening, the second obstruction spanning across the opening and intersecting the first obstruction, wherein the first obstruction and the second obstruction form waveguide structures in the rounded opening, and wherein the first obstruction and the second obstruction do not extend beyond the first surface.

2. The electromagnetic interference shield of claim 1,
    wherein the first obstruction bisects the opening; and
    wherein the second obstruction bisects the opening.

3. The electromagnetic interference shield of claim 2, wherein the second obstruction bisects the first obstruction.

4. The electromagnetic interference shield of claim 3, wherein the opening has a circular cross section.

5. The electromagnetic interference shield of claim 4, wherein the first obstruction and the second obstruction divide the opening into four quadrants.

6. The electromagnetic interference shield of claim 1, wherein the first obstruction has a thickness extending along the passageway of the opening.

7. The electromagnetic interference shield of claim 1, wherein the second obstruction has a thickness extending along the passageway of the opening.

8. The electromagnetic interference shield of claim 1,
    wherein the passageway has a vertical cross-sectional area;
    wherein the first obstruction and the second obstruction together have a total vertical obstruction cross-sectional area; and wherein the total vertical obstruction cross-sectional area is equal to or less than 20% of the vertical cross-sectional area of the passageway.

9. The electromagnetic interference shield of claim 1, wherein a cutoff frequency of the waveguide structures is 5-40 GHz.

10. An electromagnetic interference shield comprising:
a wall comprised of a conductive material, the wall having a thickness and an internal surface;
a waveguide structure extending through the thickness of the wall, the waveguide structure comprising:
  a first perimeter;
  a second perimeter, wherein the first perimeter is connected to the second perimeter by the internal surface;
  a first bar extending on the internal surface; and
  a second bar extending on the internal surface, the second bar intersecting the bar; wherein the second bar does not extend pass the internal surface.

11. The electromagnetic interference shield of claim 10, wherein the first perimeter has a circular cross section; and
wherein the second perimeter has a circular cross section.

12. The electromagnetic interference shield of claim 11, wherein the internal surface is curved.

13. The electromagnetic interference shield of claim 10, wherein the waveguide structure comprises an airflow passageway between the internal surface, the first bar, and the second bar.

14. The electromagnetic interference shield of claim 10, wherein the first bar bisects the second bar.

15. The electromagnetic interference shield of claim 10, wherein the cutoff frequency of the waveguide structure is from 5 GHz to 40 GHz.

16. An electronic device comprising:
an electromagnetic radiator; and
a housing comprised of conductive material enclosing the electromagnetic radiator, the housing comprising a first surface and a second surface; and
a first waveguide structure in the housing, the first waveguide structure comprising:
  a first circular perimeter formed in the first surface;
  a second circular perimeter formed in the second surface;
  a first internal surface extending between the first circular perimeter and the second circular perimeter; and
  a first cross extending along the first internal surface, wherein the first cross does not extend beyond the first surface.

17. The electronic device of claim 16, wherein the first waveguide structure comprises at least one air passageway between the cross and the first internal surface.

18. The electronic device of claim 17, wherein the electronic device comprises a second waveguide structure in the housing, the second waveguide structure comprising
  a third circular perimeter;
  a fourth circular perimeter;
  a second internal surface extending between the third circular perimeter and the fourth circular perimeter; and
  a second cross extending along the second internal surface, wherein the second cross has a width that is smaller than a distance from the first circular perimeter to the third circular perimeter.

19. The electronic device of claim 18, wherein a cutoff frequency of the first and second waveguide structures is 5-40 GHz.

* * * * *